United States Patent
Roozeboom et al.

(10) Patent No.: US 8,809,982 B2
(45) Date of Patent: Aug. 19, 2014

(54) ROBUST HIGH ASPECT RATIO SEMICONDUCTOR DEVICE

(75) Inventors: Freddy Roozeboom, Waalre (NL); Martijn Goossens, Veldhoven (NL); Willem Frederik Adrianus Besling, Eindhoven (NL); Nynke Verhaegh, Arnhem (NL)

(73) Assignee: NXP B.V., Eindhoven (NL)

( * ) Notice: Subject to any disclaimer, the term of this patent is extended or adjusted under 35 U.S.C. 154(b) by 203 days.

(21) Appl. No.: 13/121,268

(22) PCT Filed: Sep. 24, 2009

(86) PCT No.: PCT/IB2009/054178
§ 371 (c)(1),
(2), (4) Date: Mar. 29, 2011

(87) PCT Pub. No.: WO2010/038174
PCT Pub. Date: Apr. 8, 2010

(65) Prior Publication Data
US 2011/0180931 A1    Jul. 28, 2011

(30) Foreign Application Priority Data
Sep. 30, 2008   (EP) .................................... 08165540

(51) Int. Cl.
*H01L 27/14* (2006.01)
*B81B 3/00* (2006.01)
*B81C 1/00* (2006.01)
*H01L 29/41* (2006.01)
*H01L 49/02* (2006.01)

(52) U.S. Cl.
CPC ......... *H01L 29/41* (2013.01); *B81C 2201/0132* (2013.01); *H01L 28/91* (2013.01); *B81C 2201/0112* (2013.01); *B81B 2201/06* (2013.01); *B81B 3/007* (2013.01); *B81C 1/00619* (2013.01)
USPC .......................................................... 257/431

(58) Field of Classification Search
CPC .............. B81B 1/008; B81B 2207/056; B81B 2207/053; B81B 3/0008; B81B 3/0013; B81B 3/0016; B81B 7/0093; B81B 7/04
USPC ..................................... 257/773, E23.01, 431
See application file for complete search history.

(56) References Cited

U.S. PATENT DOCUMENTS 5,204,280 A   4/1993  Dhong et al.
5,240,558 A   8/1993  Kawasaki et al.
(Continued)

FOREIGN PATENT DOCUMENTS

JP    03-225876        10/1992
JP    2003 243517 A    8/2003
(Continued)

OTHER PUBLICATIONS

Terheiden, Barbara, et al; "The Mecor (Mechanically Corrugated) Silicon Solar Cell Concept"; IEEE; 4 Pages (2000).
(Continued)

*Primary Examiner* — Kevin Parendo

(57) ABSTRACT

The invention relates to an semi-conductor device comprising a first surface and neighboring first and second electric elements arranged on the first surface, in which each of the first and second elements extends from the first surface in a first direction, the first element having a cross section substantially perpendicular to the first direction and a sidewall surface extending at least partially in the first direction, wherein the sidewall surface comprises a first section and a second section adjoining the first section along a line extending substantially parallel to the first direction, wherein the first and second sections are placed at an angle with respect to each other for providing an inner corner wherein the sidewall surface at the inner corner is, at least partially, arranged at a constant distance R from a facing part of the second element for providing a mechanical reinforcement structure at the inner corner.

22 Claims, 6 Drawing Sheets

(56) References Cited

U.S. PATENT DOCUMENTS

| | | |
|---|---|---|
| 5,245,505 A | 9/1993 | Shiga et al. |
| 5,336,630 A | 8/1994 | Yun et al. |
| 5,466,626 A | 11/1995 | Armacost et al. |
| 5,474,950 A | 12/1995 | Kim |
| 6,878,600 B2 | 4/2005 | Birner et al. |
| 7,361,916 B2 * | 4/2008 | Gorrell et al. ............. 250/494.1 |
| 8,283,750 B2 | 10/2012 | Guiraud et al. |
| 8,395,914 B2 | 3/2013 | Klootwijk et al. |
| 2003/0156992 A1 * | 8/2003 | Anderson et al. ............. 422/100 |
| 2004/0230938 A1 * | 11/2004 | Sharpe et al. ................... 716/21 |
| 2004/0232106 A1 | 11/2004 | Oka et al. |
| 2005/0011873 A1 * | 1/2005 | Withford et al. ......... 219/121.69 |
| 2006/0131691 A1 | 6/2006 | Roozeboom et al. |
| 2006/0289380 A1 * | 12/2006 | D'Urso et al. .................. 216/11 |
| 2008/0148555 A1 | 6/2008 | Roozeboom et al. |
| 2008/0291601 A1 | 11/2008 | Roozeboom et al. |
| 2009/0142656 A1 * | 6/2009 | Nathan et al. ................. 429/129 |
| 2009/0146760 A1 | 6/2009 | Reefman et al. |
| 2009/0302419 A1 | 12/2009 | Kemmeren et al. |
| 2010/0012180 A1 * | 1/2010 | Day et al. ...................... 136/256 |
| 2010/0099268 A1 * | 4/2010 | Timans ......................... 438/761 |
| 2010/0225278 A1 | 9/2010 | Reefman et al. |
| 2010/0230787 A1 * | 9/2010 | Guiraud et al. ............... 257/532 |
| 2010/0244189 A1 | 9/2010 | Klootwijk et al. |
| 2011/0118128 A1 | 5/2011 | Tello et al. |
| 2011/0126929 A1 * | 6/2011 | Velasquez-Garcia et al. ......................... 137/561 R |

FOREIGN PATENT DOCUMENTS

| | | | |
|---|---|---|---|
| WO | 2006/056963 | A2 | 6/2006 |
| WO | 2007/125510 | A2 | 11/2007 |
| WO | 2008/023296 | A1 | 2/2008 |
| WO | 2008/139393 | A1 | 11/2008 |
| WO | 2009/063408 | A1 | 5/2009 |
| WO | 2009/150600 | A1 | 12/2009 |
| WO | 2010/007579 | A1 | 1/2010 |

OTHER PUBLICATIONS

Roozeboom, F., et al; "High-Density, Low-Loss MOS Decoupling Capacitors Integrated in a GSM Power Amplifier"; Proceedings 34$^{th}$ Int. Symp. on Microelectronics, Baltimore, MD, US; pp. 477-483 (Oct. 2001).

Jensen, Soren, et al; "Deep Reactive Ion Etching for High Aspect Ratio Microelectromechanical Components"; Physica Scripta. vol. T114; pp. 188-192 (2004).

Wang Tao, et al; "Particulate Strengthened Ni-A1203 Microcompsite HARMs for Harsh-Environmental Applicatons"; J. Micromech. Microeng., vol. 15; pp. 81-90 (Oct. 8, 2004).

Roozeboom, F., et al; "More Than 'More' Towards Passive and System-In-Package Integration"; Electrochem. Soc. Symp. Proc. Aug. 2005 pp. 16-31; (2005).

Roozeboom, F., et al; "Passive and Heterogeneous Integration Towards a Silicon-Based System in Package Concept"; Thin Solid Films, 504; pp. 391-396 (2005 or Maybe 2006).

Notten, P.H.L., et al; "3-D Integrated All-Solid-State Rechargeable Batteries"; Adv.Mat. in Press (Nov. 6, 2007).

Roozeboom, F., et al; "ALD-Options for Si-Integrated Ultrahigh-Density Decoupling Capacitors in Pore and Trench Designs"; Electrochem. Soc. Trans. 3 (15), pp. 173-181 (2007).

Roozeboom et al., "High-Density, Low-Loss MOS Capacitors for Integrated RF Decoupling," The International Journal of Microcircuits and Electronic Packaging, vol. 24, No. 3, Third Quarter, 2001 (ISSN 1063-1674).

* cited by examiner

ROBUST HIGH ASPECT RATIO SEMICONDUCTOR DEVICE

FIELD OF THE INVENTION

The invention relates to an semiconductor device comprising a first surface and neighboring first and second electric elements arranged on the first surface.

BACKGROUND OF THE INVENTION

The ever increasing demand for higher density devices for use in for instance integrated circuits (ICs) and micro electromechanical structures (MEMS) has led researchers and manufactures to investigate the use of high aspect ratio structures in such devices. High aspect ratio structures offer large surface areas but have a relatively small footprint, making them suitable for use in for example high density capacitors, batteries, biosensors and the like.

One method for increasing the surface area of a silicon substrate comprises etching pores or trenches into the substrate. A known problem with this approach is that the degree of diffusion of an etchant rapidly decreases near the bottom of a pore or trench. This phenomenon, called Aspect Ratio Dependent Etching (ARDE) has two effects: it leads to uneven etching rates along the depth of the pore or trench and also requires longer etching times to reach the same depth for narrower features.

To address this problem it has been proposed to etch pillars instead of pores into a substrate. Pillars and pores of the same diameter have essentially the same surface area. However, the larger amount of free space around the pillars on the substrate enables a greater degree of diffusion of an etchant or, in case of subsequent layer deposition, of gas or vapor species. A disadvantage of using pillar structures is that they are more fragile and likely to break due to mechanical stress during handling and/or further processing. When an array of pillars is arranged on a substrate, thermal expansion of the substrate can damage the pillars, especially near the periphery of the pillar array fields, where local symmetries and topologies in the design are disrupted.

A pillar structure offering improved stability has been disclosed in WO 2007/125510. The disclosed invention relates to an semiconductor device including an electric element, the electric element comprising a first electrode having a first surface and a pillar, the pillar extending from the first surface in a first direction, the pillar having a length measured from the first surface parallel to the first direction, the pillar having a cross section perpendicular to the first direction and the pillar having a sidewall surface enclosing the pillar and extending in the first direction, wherein the pillar comprises any one of a score and protrusion extending along at least part of the length of the pillar for giving the pillar improved mechanical stability.

In an embodiment, a plurality of such pillar electrodes is arranged in an array. Although the document mentions that the symmetry and ordering of the pillar array preferably is such that the free space around pillars is evenly distributed over the array area, the document does not mention how this can be achieved other than by placing the pillars in an equidistant grid. Furthermore, the prior art document does not offer a way to reduce the detrimental effects which differences in thermal expansion within an array can have on pillar structures.

It is an object of the present invention to provide an semiconductor device comprising improved mechanically robust high aspect ratio structures offering a high degree of diffusion.

It is a further object to provide an semiconductor device comprising mechanically robust high aspect ratio structures which are better adapted for withstanding thermal differences in the device during the manufacture and/or operation thereof.

SUMMARY OF THE INVENTION

To this end, according to a first aspect the present invention provides an semiconductor device comprising a first surface and neighboring first and second electric elements arranged on the first surface, in which each of the first and second elements extends from the first surface in a first direction, the first element having a cross section substantially perpendicular to the first direction and a sidewall surface extending at least partially in the first direction, wherein the sidewall surface comprises a first section and a second section adjoining the first section along a line extending substantially parallel to the first direction, wherein the first and second sections are placed at an angle with respect to each other for providing an inner corner, wherein the sidewall surface at the inner corner is, at least partially, arranged at a constant distance R from a facing part of the second element for providing a mechanical reinforcement structure at the inner corner.

Advantageously, a substantially constant distance between sidewall surfaces enables substantially uniform rates of etching and layer deposition, in this case at or near the inner corner(s). A uniform etching rate allows easy and precise adjustments to be made during the etching process, especially during dry etching, for example to achieve a desired etching depth. Uniform layer deposition enables the production of semiconductor devices which are less susceptible to structural error build-up when multiple layers are deposited, resulting in higher device yields. Additionally, a more uniform layer deposition may also help reduce stress related problems encountered during device lifetime testing and the equivalent of trench filling.

In an embodiment the cross section at the reinforcement structure comprises an arc of a circle. This is the preferred embodiment when the cross section of the surface facing the inner angle comprises an angle between 90 degrees and 180 degrees, or when it comprises an arc of a circle as well. A smooth inner corner as provided in this embodiment may result in more predictable and smooth end surfaces when multiple layers of materials are deposited onto the original sidewall.

In an embodiment the center of the arc of the circle is at or near the facing part of the second element. Preferably, when the facing part of the second element comprises an arc of a circle as well, both circle arcs share the same center point.

In an embodiment the center of the arc of the circle is at or near a facing outer corner of the second element. This is a preferred embodiment when the facing outer corner is neither round nor smooth.

In an embodiment the first surface is a substantially planar surface. When the elements are constructed using a lithography process, a substantially planar first surface facilitates a focused projection of the mask onto the surface.

An embodiment according to the present invention comprises an semiconductor device comprising a feature field, said feature field having a first surface on which a plurality of elements is arranged, each element extending from the first surface in a first direction substantially perpendicular to said surface and in a second direction substantially parallel to said surface, said elements comprising a plurality of adjoining walls of substantially equal height, said elements comprising, at their wall joints, a plurality of inner corners in projection onto the first surface, wherein said elements extend over substantially the entire feature field and comprise mechanical reinforcement structures at said inner corners, and wherein a substantial part of facing surfaces of separate elements are arranged at a constant distance R. The elements preferably extend in substantially a single direction over the feature field, for example over the width of the field or over the length. As well as the advantages such as more uniform rates of etching and layer deposition at or near facing surfaces of two neighboring elements which this embodiment offers, the elements which extend over substantially the entire feature field can function as thermal conductors resulting in a more gradual transfer of heat over the feature field than when smaller isolated element are used. This is especially advantageous near the periphery of the feature field where differences in temperature are likely to be found.

In an embodiment the first and second elements are of substantially similar shape and size. Devices comprising similarly shaped and sized elements can be easily aligned and checked for errors and can offer a highly homogeneous surface structure. Such a surface is suitable for instance to act as a reflective surface also having iridescent characteristics. When the distance between neighboring sidewalls is of the order of 0.5 to 10 micrometer, thus forming a regular grating, light in the visible to near infrared range will be diffracted by the elements.

In an embodiment an element further comprises one or more gaps between parts of said element, said gaps preferably spanning a constant distance R. The free space the gaps offer allow some expansion of the element without causing significant damage to the sidewalls and can thus help prevent the build up of stress in the structure during processing, especially along the direction into which the element extends.

In an embodiment the cross section of the elements comprises an interdigitated pattern. In this embodiment the elements can have sections extending away on either side of the longitudinal direction of the elements providing more structural strength and surface area when compared to trenches extending over the same feature field. Additionally, in case the sidewall surfaces are used as photon capture surfaces, photons reflected off a sidewall surface or off the first surface have a high probability of colliding with a sidewall, independent of the angle of incidence. The degree of photon capture for structures having long parallel trenches from which photons can escape after reflecting is much more dependent on the angle of incidence of the photons.

In an embodiment the cross section of an element comprises a zigzag pattern, providing more structural strength and surface area when compared to trenches extending over the same feature field. When the first surface is a plastic or flexible surface, the zigzag pattern can provide additional flexibility and/or mechanical strength for the elements.

In an embodiment the first and second sections of the sidewall surface of an element comprise rectangular sections adjacent to each other at right angles.

In an embodiment the transitions of the sidewalls of the elements to the first surface are at substantially the same level. Because facing surfaces of elements are at substantially a constant distance R from each other, the aspect ratio of etching patterns will be substantially the same over the entire field, and therefore the depth of the etching will be substantially the same across the entire field as well.

In an embodiment the width of a sidewall is of the order of 0.5 to 10 micrometer and the aspect ratio is in the order of 30 and up. In an embodiment the mutual distance of the elements is less than 10 micrometer, preferably 1 micrometer.

In an embodiment multiple electrodes according to the invention are stacked on top of each other, separated by a separating layer, in an integrated package. Thus higher density devices can be constructed with the same footprint.

By using a dielectric as the separating layer, a capacitor can be formed. Conversely, when the separating layer comprises an electrolyte, a micro battery may be formed. A higher surface catalyst area may be formed by depositing a nanoporous substrate on the sidewalls after formation of the sidewalls. The enhanced effective substrate surface can thus serve to improve the functionality of multilayer stacks.

In an embodiment the first surface and the plurality of elements thereon comprise one of a photovoltaic, beta voltaic, capacitor, all solid-state micro battery, a catalyst or biosensor surface. Obviously, in the fields of photo- and beta voltaics a large surface area on which to trap particles is advantageous. Capacitors and micro batteries (e.g. Li-ion, etc.) can store more energy when the surfaces of their electrodes are large. Additionally a very uniform deposition of the dielectric layer may improve the breakdown voltage of a capacitor. Likewise the uniform deposition of a solid-state electrolyte (e.g. Li-containing) may improve the performance of a micro battery.

According to a further aspect the invention provides a reticle comprising a pattern for producing an semiconductor device as described earlier herein.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE DRAWINGS

Figure 1:
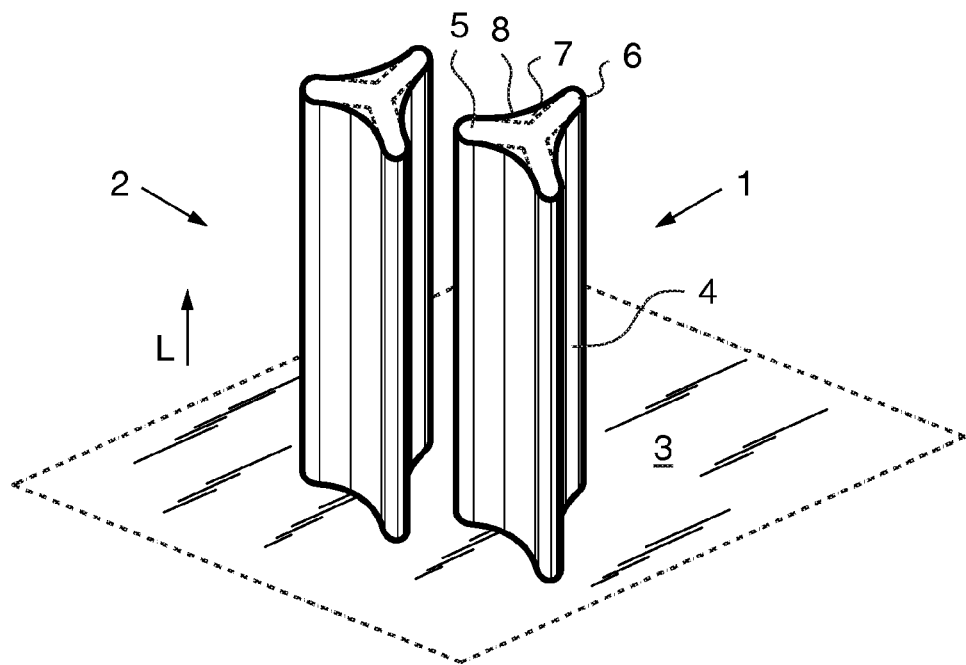
FIG. 1 shows a perspective view of a first embodiment of an element according to the present invention.

FIG. 1 shows an semiconductor device comprising a first surface 3, on which surface a first element 1 and neighboring element 2 have been arranged. Both elements extend from the surface in a first direction L perpendicular to the first surface. The first element 1 has a sidewall surface 4 extending at least partially in the first direction L. The first element 1 further comprises two sections 5 and 6 which adjoin each other along a line (not shown) extending substantially parallel to the first direction L. Along this line the two sections join at an inner corner 7. A reinforcing structure 8 adds structural strength to the element at or near the inner corner 7 and is shaped such that the sidewall surface 4 of the first element 1 at or near the inner corner is arranged at a substantially constant distance from a facing part of the second element 2. Due to the relative placement of the inner corner of the first element and the facing surface of the second element, uniform rates of etching and layer deposition can be achieved at or near said inner corner.

Figure 2:
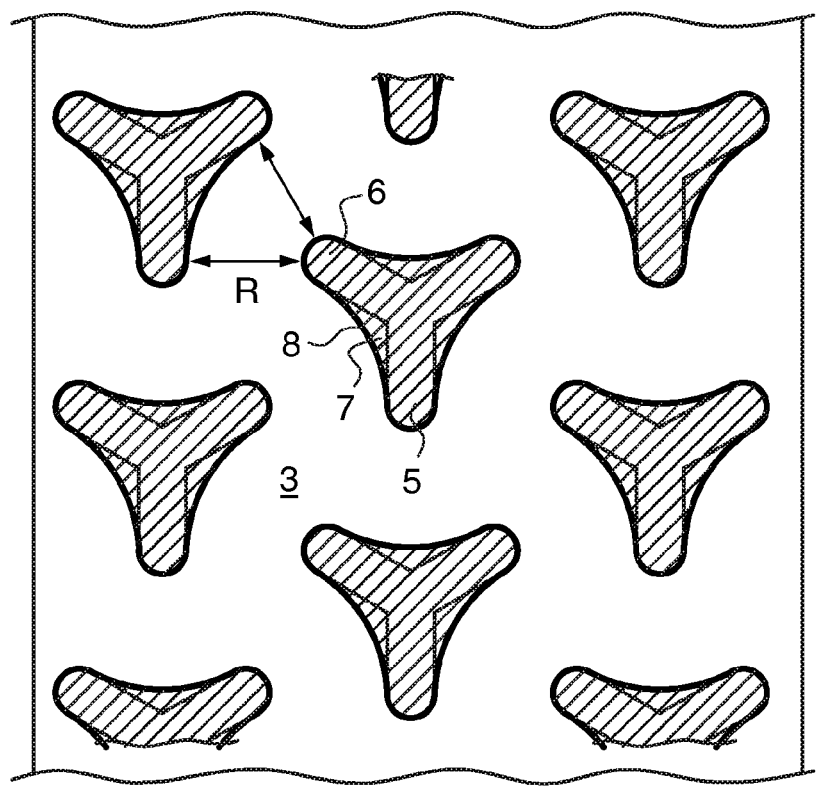
FIG. 2 shows a cross-sectional view of a grid of elements similar to the element shown in FIG. 1.

FIG. 2 shows a cross section of an array of elements as shown in FIG. 1, taken through a plane parallel to the first surface. It can be seen that the distance between inner corners and sidewalls facing those inner corners is substantially equal to R for all elements in the array. In this embodiment, the distance between a point on the sidewall of a first element to a closest point on another element is at least R, but not substantially more than R. This allows substantially uniform rates of etching and/or layer deposition over the entire first surface.

Figure 3:
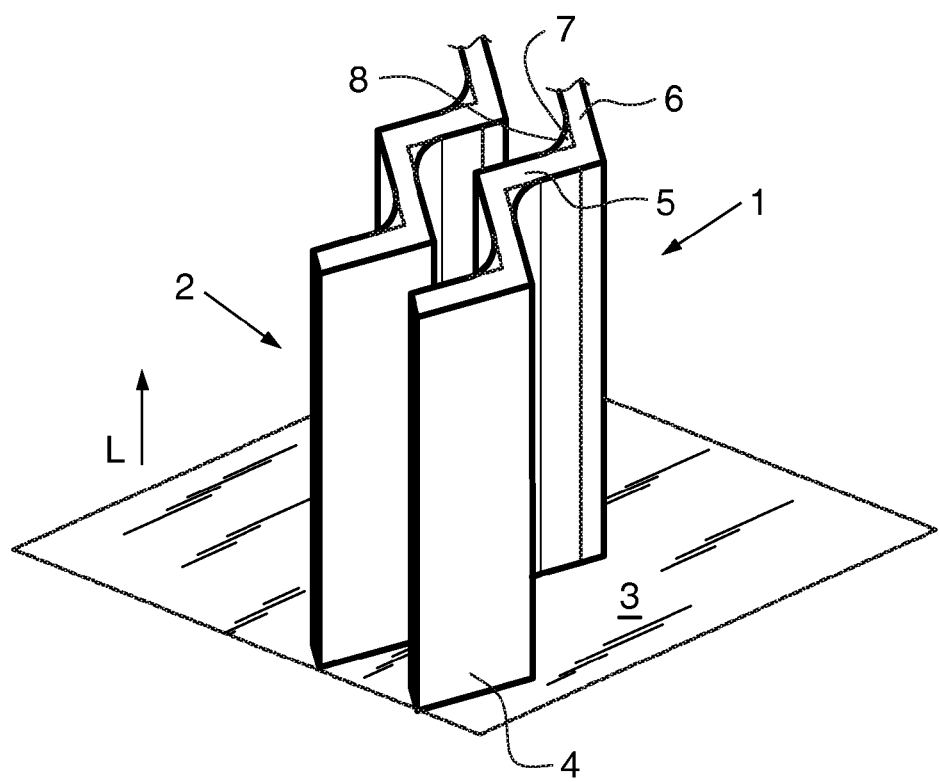
FIG. 3 shows a perspective view of a second embodiment of an element according to the present invention.

FIG. 3 shows part of a second embodiment of the current invention in a perspective view. First element 1 and second element 2 are shown extending from a first surface 3 in a first direction L. The first surface 3 is comprised in a feature field which features the elements defining the behavior of the device. The elements each comprise a plurality of adjoining sections and extend over the entire feature field, i.e. extend from one edge of the field to another. In FIG. 3 sections 5 and 6 of the first element are labeled, though each element may comprise many more sections. Sections 5 and 6 join at an inner corner 7 at a line (not shown) extending in a direction substantially parallel to the first direction L. Elements 1 and 2 comprise mechanical reinforcement structures 8 at their inner corners and are arranged such that a substantial part of facing surfaces of separate elements are arranged at a constant distance R. Because at any point neighboring elements are arranged at substantially the same distance, etching can occur homogeneously during the process, i.e. in a cross section taken perpendicular to the first direction L the effects of etching rate will be the same over the entire cross section. Problems caused by ARDE (aspect ratio dependent etching) are thus greatly reduced.

As the elements stretch out over the entire feature field, they can conduct heat from one edge of the field to another. This is especially advantageous near the edges of the feature field, which are more likely to be affected by large differences in thermal expansion, resulting in damage to the substrate or, in the prior art case, pillars, especially near the periphery of pillar array fields, where local symmetries and topologies in the design are disrupted. In the prior art, pillars near the edges of a feature field are often of a lower quality than those near the center, in some cases even broken. Because the elements according to the invention are not isolated on a small part of the feature field, they can expand and contract at the same rate as the field itself, thus being less subjected to compressive and tensile forces than elements which do not extend over the field.

Figure 4:
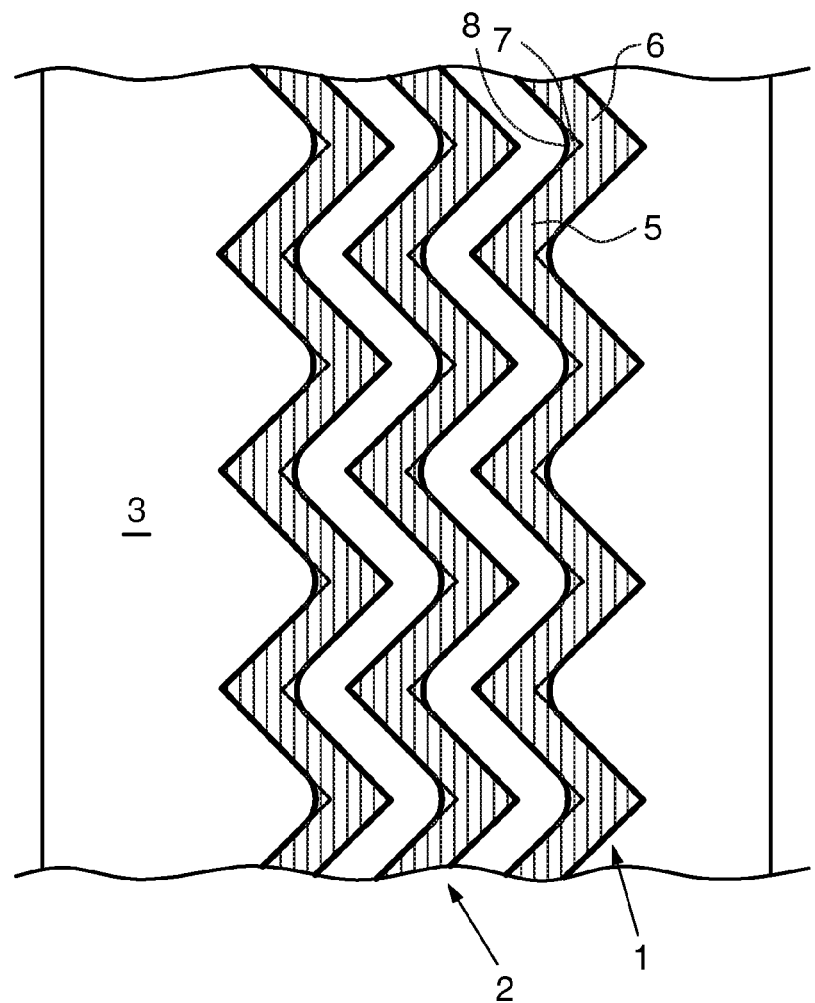
FIG. 4 shows a cross-sectional view of a grid of elements similar to the element shown in FIG. 2, FIGS. 5, 6 and 7 show cross-sectional views of further embodiments according to the invention.

FIG. 4 shows a cross sectional view of an array of elements as shown in FIG. 3. It can clearly be seen that the "trenches" between facing sidewalls have substantially the same width at any point, facilitating a constant rate of diffusion during etching and/or layer deposition. An additional advantage is that after trench filling, tensile or compressive forces acting on the sidewalls because of differences in coefficients of thermal expansion between the filler material and the sidewalls are opposed by equal but opposite forces exerted by the filler material on the other side of the sidewall. When compared to prior art trenches, the elements of the present invention offer the advantages of larger surface areas and more robust mechanical stability. The reinforcing structure 8 at the inner corner 7 provides extra strength and also offers some protection against cracks or fissures forming at the inner corners. Moreover, heat can be conducted and dissipated along the length of the elements thus reducing the build-up of large thermally induced layer strain on different parts on the field.

Figure 5:
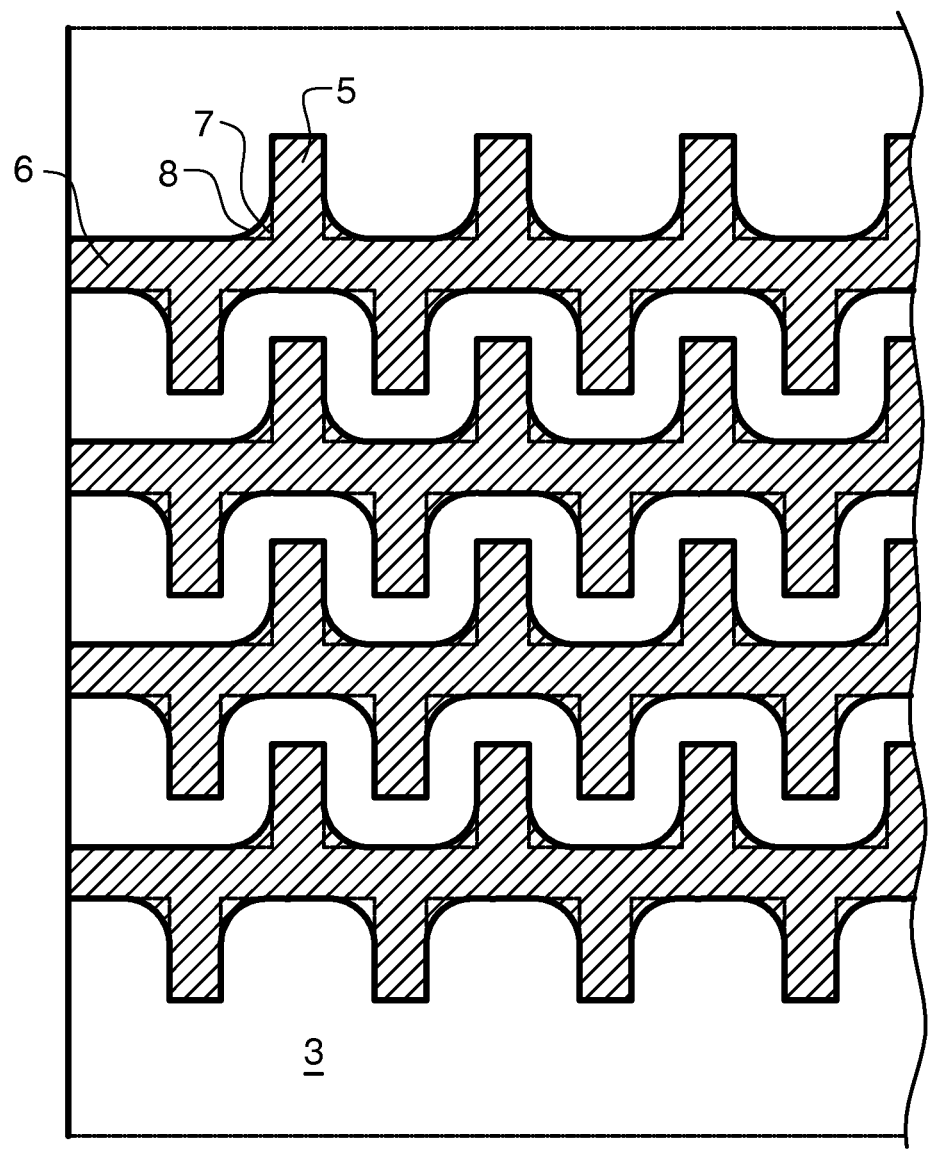

In FIG. 5 a cross section of elements of a third embodiment of the present invention is shown. Besides offering a more mechanically robust structure with a high surface area, this structure used for "trapping" particles such as photons or beta particles incident on the first surface 3; in case these particles reflect off the first surface or off a sidewall surface, there is a high probability that the particles will collide with another surface of the device and be absorbed on the rebound. As in the previous embodiments, inner corners of the elements are reinforced with reinforcing structures which also serve to keep the elements equidistant. The elements extend over the first surface 3, forming an interdigitated or corrugated pattern. Each element has a large sidewall surface area and is further supported on two sides by sections perpendicular to the direction in which the element extends over first surface. Again, the sidewall surfaces of elements are placed substantially equidistantly from sidewall surfaces of their neighboring elements, allowing uniform diffusion.

Figure 6:
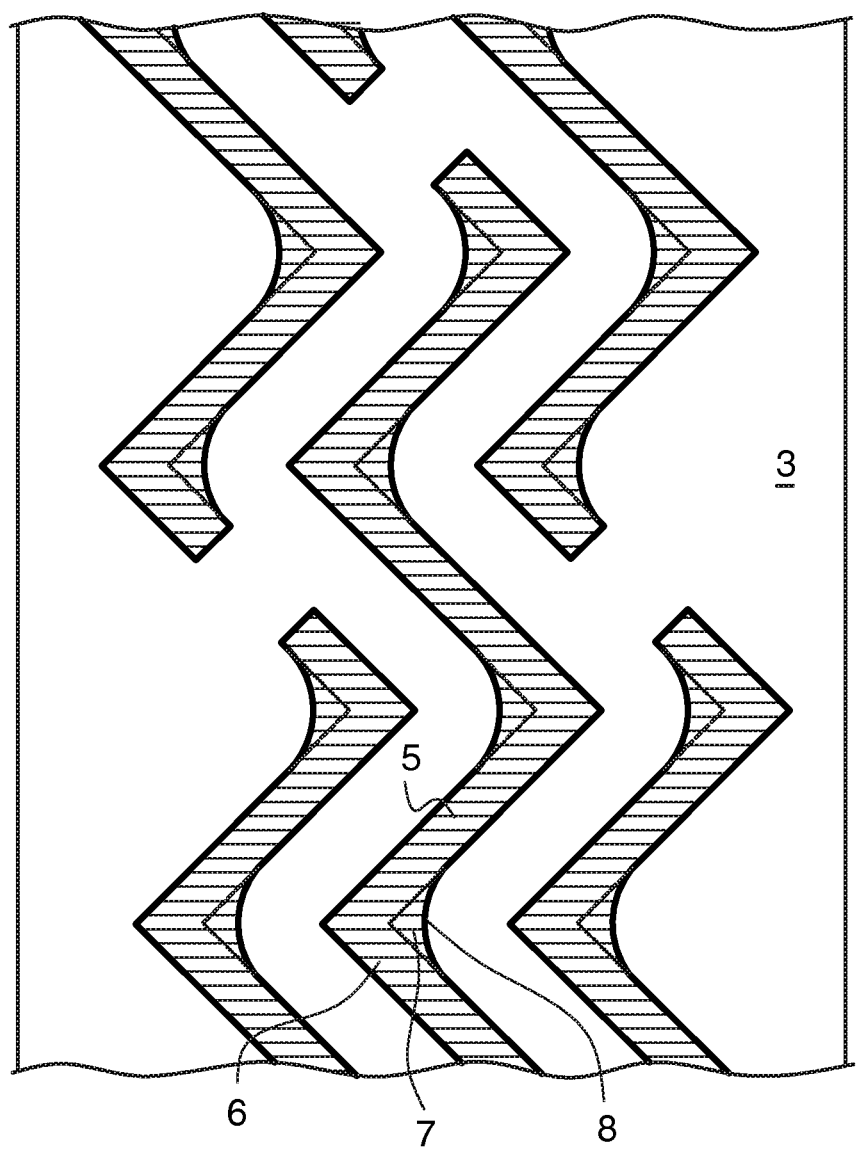
Figure 7:
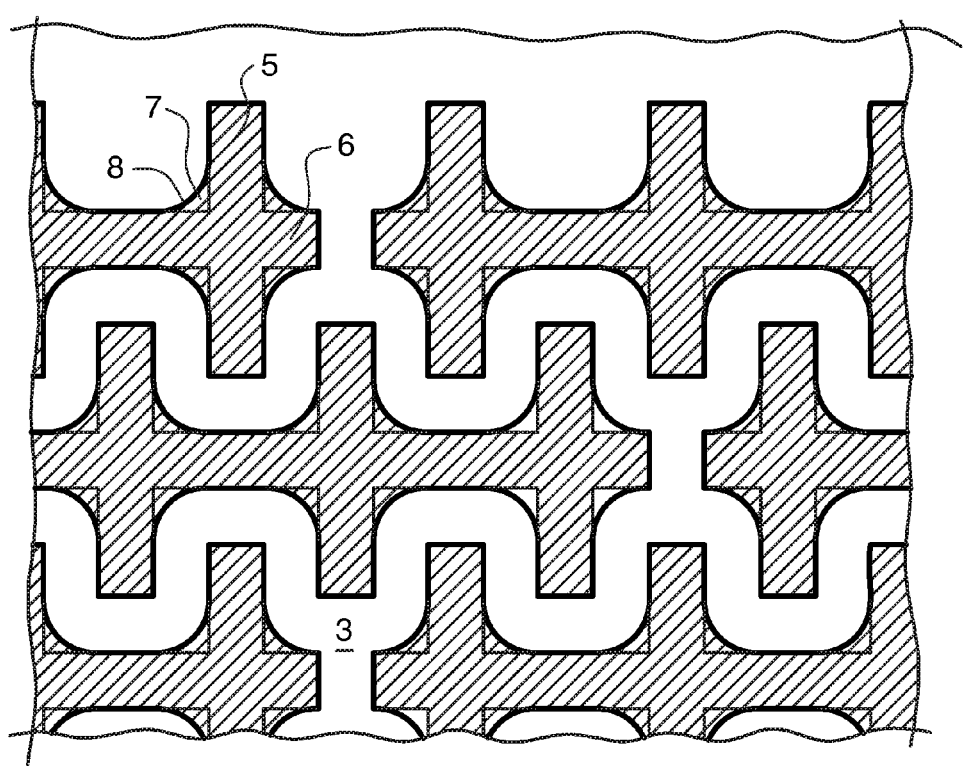

When elements extending over substantially the entire field are subjected to stress during for example processing, gaps in the elements as shown in the embodiments depicted in FIGS. 6 and 7 offer some room for at least partial movement or expansion of said elements without significantly damaging the sidewalls. Preferably these gaps are located equidistantly in the elements. More preferably the distance spanned by a gap is substantially a constant distance R, thus ensuring that parts of an element separated by a gap are not closer to each other than said distance R.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Semiconductor device comprising
a first surface and
a plurality of neighboring elements arranged on the first surface, in which each of the plurality of neighboring elements extends from the first surface in a first direction, and has a cross section substantially perpendicular to the first direction and sidewall surfaces extending at least partially in the first direction,
a first section and a second section adjoined along a line extending substantially parallel to the first direction, and placed at an angle with respect to each other for providing an inner corner, and
a mechanical reinforcement structure that includes a sidewall surface at the inner corner, the sidewall surface extending along a path in the cross section from the first section to the second section and arranged along the path at a constant distance R from a facing part of a respective neighboring element from the plurality of neighboring elements.

2. Semiconductor device according to claim 1, in which the cross section at the reinforcement structure comprises an arc of a circle, and wherein the plurality of neighboring elements each have an aspect ratio greater than or equal to 30 and are separated by less than 10 micrometers.

3. Semiconductor device according to claim 1, in which the first surface comprises a feature field and each of the plurality of neighboring elements extends over substantially the entire feature field, and wherein the plurality of neighboring elements includes the first and second sections, and the mechanical reinforcement structure.

4. Semiconductor device according to claim 3, wherein at least one of the plurality of neighboring elements conducts heat from a first edge of the feature field to a second opposite edge of the feature field.

5. Semiconductor device according to claim 3, further comprising a filler material between the plurality of neighboring elements in the feature field.

6. Semiconductor device according to claim 3, wherein the plurality of neighboring elements are separated with the constant distance R in the feature field to facilitate a constant rate of diffusion during deposition of a filler material between the plurality of neighboring elements in the feature field.

7. Semiconductor device according to claim 1, in which a first one of the plurality of neighboring elements has a shape and size that is the same as a shape and size of a second one of the plurality of neighboring elements.

8. Semiconductor device according to claim 1, wherein the plurality of neighboring elements are spaced from one another by a gap, said gaps spanning the constant distance R.

9. Semiconductor device according to claim 1, in which the cross section is an interdigitated pattern.

10. Semiconductor device according to claim 1, in which the cross section is a zigzag pattern.

11. Semiconductor device according to claim 1, wherein the first and second sections comprise rectangular sections adjacent to each other at right angles.

12. Semiconductor device according to claim 1 in which transitions of the sidewalls of the elements to the first surface are at the same level.

13. Semiconductor device according to claim 1, in which the first and second sections each have a width between 0.5 and 10 micrometers, and the plurality of neighboring elements each have an aspect ratio greater than or equal to 30 and are separated by less than 10 micrometers.

14. Semiconductor device, comprising a plurality of electrodes, each including a first surface and a plurality of neighboring elements as in claim 1, and wherein the plurality of neighboring elements comprise a feature field configured and arranged to conduct heat from one edge of the field to another edge.

15. Semiconductor device according to claim 1, in which the first surface and the plurality of neighboring elements thereon comprise one of the group of a photovoltaic, beta voltaic, capacitor, micro battery, catalyst or biosensor surface, and wherein the plurality of neighboring elements comprise a feature field configured and arranged to conduct heat from one edge of the field to another edge.

16. Semiconductor device according to claim 1, wherein first and second sections each have a width between 0.5 and 10 micrometers, and the plurality of neighboring elements each have an aspect ratio greater than or equal to 30 and are separated by a distance less than 1 micrometer.

17. Semiconductor device according to claim 1, wherein each of the plurality of neighboring elements further includes a third section, the third section adjoined to the first and second sections along a line extending substantially parallel to the first direction, and the third section placed at an angle with respect to the first and section sections for providing another inner corner.

18. Semiconductor device according to claim 1, wherein the plurality of neighboring elements are configured and arranged to capture particles along the sidewall surfaces by reflecting particles off of the first section to the second section, and absorbing the particles into the second section.

19. Semiconductor device comprising
a first surface and
a plurality of neighboring elements arranged on the first surface, in which each of the plurality of neighboring elements extends from the first surface in a first direction, and has a cross section substantially perpendicular to the first direction and sidewall surfaces extending at least partially in the first direction,
a first section and a second section adjoined along a line extending substantially parallel to the first direction, and placed at an angle with respect to each other for providing an inner corner, and
a mechanical reinforcement structure that includes a sidewall surface at the inner corner, the sidewall surface extending along a path in the cross section from the first section to the second section and arranged along the path at a constant distance R from a facing part of a respective neighboring element from the plurality of neighboring elements, in which a center of the arc of the circle is at the facing part of the respective neighboring element, and wherein the plurality of neighboring elements comprise a feature field configured and arranged to conduct heat from one edge of the field to another edge.

20. Semiconductor device comprising
a first surface and
a plurality of neighboring elements arranged on the first surface, in which each of the plurality of neighboring elements extends from the first surface in a first direction, and has a cross section substantially perpendicular to the first direction and sidewall surfaces extending at least partially in the first direction,
a first section and a second section adjoined along a line extending substantially parallel to the first direction, and placed at an angle with respect to each other for providing an inner corner, and
a mechanical reinforcement structure that includes a sidewall surface at the inner corner, the sidewall surface extending along a path in the cross section from the first section to the second section and arranged along the path at a constant distance R from a facing part of a respective neighboring element from the plurality of neighboring elements, in which a center of the circle is at a facing outer corner of the respective neighboring element, and wherein a trench formed between the plurality of neighboring elements is filled with a filler material configured and arranged to exert forces on the sidewall surfaces that are equal and opposite the forces exerted by the filler material on the other side of the sidewall surfaces.

21. Reticle, comprising a photomask pattern that is configured and arranged to identify boundaries of components of a semiconductor device comprising
a first surface;
a plurality of neighboring elements arranged on the first surface, in which each of the plurality of neighboring elements extends from the first surface in a first direction, and has a cross section substantially perpendicular to the first direction and sidewall surfaces extending at least partially in the first direction;
a first section and a second section adjoined along a line extending substantially parallel to the first direction, and placed at an angle with respect to each other for providing an inner corner; and
a mechanical reinforcement structure that includes a sidewall surface at the inner corner, the sidewall surface extending along a path in the cross section from the first section to the second section and arranged along the path at a constant distance R from a facing part of a respective neighboring element from the plurality of neighboring elements.

22. The reticle according to claim 21, wherein the cross section at the reinforcement structure comprises an arc of a circle, and the plurality of neighboring elements comprise a feature field configured and arranged to conduct heat from one edge of the field to another edge.

\* \* \* \* \*